(12) United States Patent
Ishikawa et al.

(10) Patent No.: US 7,507,350 B2
(45) Date of Patent: *Mar. 24, 2009

(54) ETCHING LIQUID COMPOSITION

(75) Inventors: Norio Ishikawa, Saitama-ken (JP); Kiyoto Mori, Saitama-ken (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 79 days.

This patent is subject to a terminal disclaimer.

(21) Appl. No.: 11/128,622

(22) Filed: May 13, 2005

(65) Prior Publication Data

US 2005/0209119 A1  Sep. 22, 2005

Related U.S. Application Data

(63) Continuation of application No. 09/947,483, filed on Sep. 6, 2001, now Pat. No. 6,914,039.

(30) Foreign Application Priority Data

Sep. 8, 2000  (JP)  ............... 2000-272528

(51) Int. Cl.
    *C09K 13/00*  (2006.01)
(52) U.S. Cl. .................... 252/79.1; 252/79.2; 252/79.3; 252/79.4
(58) Field of Classification Search ............... 252/79.1, 252/79.2, 79.3, 79.4
    See application file for complete search history.

(56) References Cited

U.S. PATENT DOCUMENTS

| | | | |
|---|---|---|---|
| 3,898,141 A | 8/1975 | Ermanis et al. | |
| 4,344,863 A | 8/1982 | Robbins et al. | |
| 4,532,066 A * | 7/1985 | Paszek et al. | 510/400 |
| 5,264,109 A * | 11/1993 | Kirkman | 205/212 |
| 5,489,735 A * | 2/1996 | D'Muhala et al. | 588/1 |
| 5,968,848 A | 10/1999 | Tanabe et al. | |
| 5,972,862 A | 10/1999 | Torii et al. | |
| 6,117,220 A | 9/2000 | Kodama et al. | |
| 6,284,721 B1 | 9/2001 | Lee | |
| 6,310,019 B1 | 10/2001 | Kakizawa et al. | |
| 6,914,039 B2 * | 7/2005 | Ishikawa et al. | 510/176 |

FOREIGN PATENT DOCUMENTS

| | | |
|---|---|---|
| EP | 0 532 920 A2 | 8/1992 |
| EP | 0 691 676 A1 | 2/1994 |
| JP | 63-114132 | 10/1986 |
| JP | 07141932 A | 2/1992 |
| JP | 11029882 A | 2/1999 |
| WO | WO 00/11107 A1 | 3/2000 |

OTHER PUBLICATIONS

Database WPI, Section Ch, Week 200043, Derwent Publications Ltd., London, GB; AN 2000-483459 (XP002242409) (Jan. 2000).

* cited by examiner

*Primary Examiner*—Nadine G Norton
*Assistant Examiner*—Mahmoud Dahimene
(74) *Attorney, Agent, or Firm*—Wolf, Greenfield & Sacks, P.C.

(57) ABSTRACT

The invention provides etching liquid compositions for transparent conducting films wherein foaming is suppressed and residues do not occur after etching. The etching liquid compositions include an etching liquid for transparent conducting films and one or more compounds selected from the group consisting of polysulfonic acid compounds and polyoxyethylene-polyoxypropylene block copolymers.

6 Claims, No Drawings

ETCHING LIQUID COMPOSITION

RELATED APPLICATIONS

This application is a continuation of U.S. patent application Ser. No. 09/947,483, filed Sep. 6, 2001, which is incorporated herein by reference in its entirety.

FIELD OF THE INVENTION

The present invention relates to an etching liquid for transparent electrode films of LCDs and other display elements.

BACKGROUND OF THE INVENTION

While indium tin oxide, indium oxide, tin oxide, zinc oxide, etc. are all used as transparent electrodes of LCDs and electroluminescent display elements, indium tin oxide (called ITO hereinafter) is mainly used for this purpose. Examples of conventional etching liquids for ITO-films are 1. aqueous solutions of iron (III) chloride, 2. aqueous solutions of iodic acid, 3. aqueous solutions of phosphoric acid, 4. mixed solutions of hydrochloric acid and nitric acid (aqua regia), 5. aqueous solutions of oxalic acid, etc. However, these etching liquids are not adequate for practical use because of the following problems:

1. Aqueous solutions of iron (III) chloride are inexpensive and have a high etching speed; however, they have the disadvantage that with these solutions the amount of side-etching is high and that they contain Fe which has a negative influence on semiconductors.

2. With aqueous solutions of iodic acid, which have good etching characteristics, the amount of side-etching is low; however, in addition to being expensive, they lack stability because iodine is easily released.

3. Aqueous solutions of phosphoric acid, in addition to etching Al used on wiring, have the disadvantage that a residue remains after etching.

4. Mixed solutions of hydrochloric acid and nitric acid (aqua regia) change rapidly over time, making process control difficult and delivery impossible.

5. Aqueous solutions of oxalic acid have many advantages such as excellent stability, low cost, and the fact that they do not etch Al, etc.; however, a residue remains after etching with these solutions.

Regarding the residues which occur when using an aqueous solution of oxalic acid, JP, A, 7-141932 discloses a technique for reducing the residues by using dodecylbenzenesulfonic acid; however, this has the disadvantage of intense foaming.

Moreover, the process of forming a silicon nitride film etc. on a glass substrate and forming ITO film thereon is examined in these years, and the structure of the element is changing. Therefore, removing property of the residue is becoming insufficient.

SUMMARY OF THE INVENTION

Thus, it is an object of the present invention to solve the above-mentioned problems of the prior art and to provide an etching liquid for transparent conducting films wherein foaming is suppressed and residues do not occur after etching.

By conducting extensive studies, the inventors of the present invention have discovered that the above-mentioned problems can be solved by including a polysulfonic acid compounds and a specific surfactant in an etching liquid for transparent conducting films and, as a result of further research, have completed the present invention.

One aspect of the present invention relates to an etching liquid composition comprising an etching liquid for transparent conducting films and one or more compounds selected from the group consisting of polysulfonic acid compounds and polyoxyethylene-polyoxypropylene block copolymers.

Another aspect of the present invention relates to the before-mentioned composition wherein the transparent conducting film is an indium tin oxide (ITO) film.

The present invention, in some aspects, also relates to the before-mentioned compositions wherein the etching liquid for transparent conducting films is an aqueous solution of oxalic acid.

The present invention, in other aspects, further relates to the before-mentioned compositions wherein the concentration of the one or more compounds selected from the group consisting of polysulfonic acids compounds and polyoxyethylene-polyoxypropylene block copolymers is in the range from 0.0001 to 10 mass percentages.

In yet other aspects, the present invention relates to the before-mentioned compositions wherein polysulfonic acids compounds are one or more compounds selected from the group consisting of naphthalene sulfonic acid-formaldehyde condensates and their salts, polystyrene sulfonic acids and their salts, and lignosulfonic acids and their salts.

In further aspects of the invention, the present invention relates to the before-mentioned compositions further comprising a sulfonate type anionic surfactant.

The present invention, in still further aspects, also relates to the before-mentioned compositions further comprising water-soluble lower alcohols.

In additional aspects, the present invention further relates to the before-mentioned composition wherein water-soluble lower alcohols are one or more compounds selected from the group consisting of methanol, ethanol, n-propanol, isopropanol and n-butanol.

In still further aspects, the present invention also relates to the before-mentioned compositions wherein the concentration of water-soluble lower alcohols is in the range from 1 to 10 mass percentages.

According to the present invention, it has been found that polyoxyethylene-polyoxypropylene block copolymers have the effect of removing the residues remaining after etching an ITO-film and, surprisingly, that by combining polyoxyethylene-polyoxypropylene block copolymers with polysulfonic acids compounds and a sulfonate type anionic surfactant the residue removing effect is greatly increased. It has further been found that polyoxyethylene-polyoxypropylene block copolymers and water-soluble alcohols have the effect of suppressing the foaming caused by sulfonate type anionic surfactants.

BEST MODES FOR CARRYING OUT THE INVENTION

Below, the best modes for carrying out the invention will be described in detail.

Firstly, the concentration of the oxalic acid used in the present invention is set in a range in which crystals are not precipitated and in which the etching speed is sufficient. With a concentration of 0.1 mass percentages or less of oxalic acid the etching speed at 50° C. is 100 Å/min. or less, which is not sufficient for practical use. With a concentration of 10 mass percentages or more precipitation of crystals occurs at 25° C. or less, which causes problems with regard to shelf life and delivery. Particularly preferred concentrations are in the range from 0.5 to 5 mass percentages.

The polysulfons used in the present invention are high molecular compounds such as naphthalene sulfonic acid-formaldehyde condensates and their salts, polystyrene sulfonic acids and their salts, lignosulfonic acids and their salts, polyethylene sulfonic acids and their salts, etc.; and aromatic polysulfonic acids such as 1,5-naphthalene-disulfonic acid, 1-naphthol-3,6-disulfonic acid, etc, and their salts. Among these naphthalene sulfonic acid-formaldehyde condensates and their salts, polystyrene sulfonic acids and their salts and lignosulfonic acids and their salts, are particularly preferred.

Naphthalene sulfonic acid-formaldehyde condensates and their salts are commercially available under trade names such as Polystar NP-100 (of Nippon Oil & Fats Co., Ltd.), Runox 1000, 1000C, 1500A (of Toho Chemical Industry Co., Ltd.), Ionet D-2, Sanyo Levelon PHL (of Sanyo Chemical Industries, Ltd.), Loma PWA-40 (of Sannopku Co., Ltd.), Demol N, Demol AS (of KAO Soap Co., Ltd.), etc. Loma PWA-40 and Demol AS, which are ammonium salts and free acids, are especially preferred. Polystyrene sulfonic acids and their salts and lignosulfonic acids and their salts are commercially available as sodium salt under the trade names of Polity 1900 (of Lion Corporation) and Sorpol 9047K (of Toho Chemical Industry Co., Ltd.) respectively. For applications in the electronics industry sodium and other metals are not desirable; however, these sodium salts can be used if the sodium is removed by a treatment with an ion exchange resin etc.

The polyoxyethylene-polyoxypropylene block copolymers used in the present invention not only have, by themselves, the effect of reducing the residues remaining after etching an ITO-film, but in addition to these removal properties which are greatly improved by combining them with the before-mentioned polysulfonic acid compounds, they also have the effect of reducing foaming. A great number of polyoxyethylene-polyoxyprop-ylene block copolymers with different molecular weights and different proportions of polyoxyethylene to polyoxypropylene is commercially available from surfactant manufacturers. There are, e.g., those of the Newpol PE-Series (PE-61, 62, 64, 68, 71, 74, 75, 78, 108, 128) from Sanyo Chemical Industries Co., Ltd. and those of the Epan-Series (Epan 410, 420, 450, 485, 710, 720, 740, 750, 785) from Daiichi Pharmaceutical Co., Ltd. etc. Copolymers with a high proportion of polyoxypropylene, i.e. 80 to 90 mass percentages, have good defoaming properties, while copolymers with 50 mass percentages or more of polyoxyethylene are good for removing the residues remaining after etching.

Examples of sulfonate type anionic surfactants used in the present invention are alkyl benzene sulfonic acids such as dodecylbenzene sulfonic acid and their salts, alkyl sulfate esters and their salts, dialkyl esters of sulfosuccinic acids and their salts, polyoxyethylene alkyl ether sulfonic acids and polyoxyethylene allyl ether sulfonic acids and their salts, etc. Among these polyoxyethylene alkyl ether sulfonic acids and polyoxyethylene allyl ether sulfonic acids and their salts are particularly preferred because their foaming is relatively insignificant. These are commercially available under trade names such as Newcol 560SF, Newcol 707SF from Nippon Nyukazai Co., Ltd. and Nissan Avanel S-Series from Nippon Oil & Fats Co., Ltd. etc. These sulfonate type anionic surfactants, similar to the polysulfonic acid compounds mentioned before, have the ability to remove etching residues; however, due to their foaming properties they are not sufficient on their own. In order to suppress foaming water-soluble lower alcohols may be added. As water-soluble lower alcohol methanol, ethanol, n-propanol, isopropanol, n-butanol, etc. can be used. Preferably, the concentration of water-soluble lower alcohols is in the range from 1 to 10 mass percentages. If the concentration is low, the use effect cannot be obtained, while swelling of the resist and other problems occur if the concentration is too high.

The concentration of these polysulfonic acid compounds, sulfonate type anionic surfactants and polyoxyethylene-polyoxypropylene block copolymers is in the range from 0.0001 to 10 mass percentages, and preferably in the range from 0.001 to 10 mass percentages. When combining polysulfonic acid compounds and polyoxyethylene-polyoxypropylene block copolymers, the polysulfonic acid compounds are in the range from 0.001 to 10 mass percentages and the polyoxyethylene-polyoxypropylene block copolymers are in the range from 0.0001 to 1 mass percentages. The polysulfonic acids compounds and the polyoxyethylene-polyoxypropylene block copolymers can be freely proportioned within these concentration ranges. If the concentration of polysulfonic acid compounds, sulfonate type anionic surfactant and polyoxyethylene-polyoxypropylene block copolymers is low, the residue removing effect is not sufficient, and if the concentration is too high, a proportionate effect cannot be expected. It is necessary to properly select these compounds depending upon the material of substrates of ITO film. For example, on glass substrates, polysulfonic acid compounds have their effect at 0.001 to 0.1 mass percentages, but, on silicon nitride films, they have their effect only when the concentration is raised to 0.1 to 10 mass percentages.

Below Examples of the present invention are given together with Comparative Examples in order to describe the present invention in greater detail, without, however, limiting it to these Examples.

EXAMPLES

Table 1 shows etching liquids according to the present invention together with etching liquid composition given for the purpose of comparison.

TABLE 1

|  | Oxalic acid (mass %) | Polysulfonic acid compounds | Sulfonate type anionic surfactant | Polyoxethylene-polyoxypropylene block copolymers | Water-soluble alcohol |
|---|---|---|---|---|---|
| Comparative Example 1 | 3.4 |  |  |  |  |
| Comparative Example 2 | 3.4 |  | dodecylbenzene-sulfonic acid 0.03 mass % |  |  |
| Example 1 | 3.4 | Polity 1900 0.1 mass % |  |  |  |

TABLE 1-continued

| | Oxalic acid (mass %) | Polysulfonic acid compounds | Sulfonate type anionic surfactant | Polyoxethylene-polyoxypropylene block copolymers | Water-soluble alcohol |
|---|---|---|---|---|---|
| Example 2 | 3.4 | Demol AS 0.1 mass % | | | |
| Example 3 | 3.4 | Sorpol 9047K 0.1 mass % | | | |
| Example 4 | 3.4 | | | Epan 485 0.001 mass % | |
| Example 5 | 0.5 | Polity 1900 0.01 mass % | | | |
| Example 6 | 5.0 | Polity 1900 0.1 mass % | | | |
| Example 7 | 3.4 | Polity 1900 0.001 mass % | | Epan 785 0.01 mass % | |
| Example 8 | 3.4 | Polity 1900 0.01 mass % | | Epan 785 0.01 mass % | |
| Example 9 | 3.4 | Sorpol 9047K 0.1 mass % | | Epan 785 0.1 mass % | |
| Example 10 | 3.4 | Demol AS 0.01 mass % | | Epan 485 0.01 mass % | |
| Example 11 | 3.4 | | Newcol 707SF 0.03 mass % | Epan 710 0.005 mass % | methanol 10 mass % |
| Example 12 | 3.4 | | Newcol 707SF 0.03 mass % | Epan 710 0.005 mass % | 2-propanol 10 mass % |
| Example 13 | 3.4 | | Newcol 707SF 0.03 mass % | Epan 710 0.005 mass % | n-butanol 5 mass % |
| Example 14 | 3.4 | Polity 1900 10.0 mass % | | | |
| Example 15 | 3.4 | Demol AS 1.0 mass % | | | |

Notes:
Water was added to make up a total mass of 100.
Polity 1900: polystyrene sulfonate sodium salt manufactured by Lion Corporation.
Sorpol 9047K: lignosulfonic acid sodium salt manufactured by Toho Chemical Industry Co., Ltd.
Demol AS: ammonium salt of naphthalene sulfonate-formalin condensates manufactured by KAO Soap Co., Ltd.
Newcol 707SF: ammonium salt of special polyoxyethylene allyl sulfonate ammonium salt manufactured by Nippon Nyukazai Co., Ltd.
Epan 485, 710, 785: polyoxyethylene-polyoxypropylene block copolymers manufactured by Daiichi Pharmaceutical Co., Ltd.

Regarding the etching liquids shown above, the following items were investigated:

(Foaming—Foam Height—)

A test sample of 20 ml was introduced into a 100 ml calorimetric tube which was set in a TS-type shaker and shaken for 2 minutes. Foaming was evaluated by measuring the foam height 30 seconds and again 5 minutes after the shaking had stopped.

(Etching Speed)

A substrate on which a resist pattern had been formed on a 1500 Å thick amorphous ITO-film was submerged for 1 minute in an etching liquid with a temperature of 50° C., and after rinsing and drying the substrate and stripping the resist mask, the amount of etching was measured with a tracer film thickness meter.

(Etching Residues)

1. The residues remaining after etching a glass substrate on which an ITO-film had been formed for 1.8 times the just etching time calculated from the etching speed were evaluated by electron microscope observation.

2. The residues remaining after etching a glass substrate on which first a silicon nitride film and then an ITO-film had been formed for 1.8 times the just etching time calculated from the etching speed were evaluated by electron microscope observation.

The results are shown in Table 2.

TABLE 2

| | Foaming (foam height) in mm | | Etching speed in A/min. | Residues remaining after etching | |
|---|---|---|---|---|---|
| | after 30 sec. | after 5 min. | | 1 | 2 |
| Comparative Example 1 | 0 | 0 | 1350 | x | x |
| Comparative Example 2 | 180 | 160 | 1320 | + | x |
| Example 1 | 0 | 0 | 1320 | ○ | |
| Example 2 | 0 | 0 | 1300 | ○ | ○ |
| Example 3 | 6 | 0 | 1350 | ○ | ○ |
| Example 4 | 5 | 0 | 1320 | ○ | |
| Example 5 | 0 | 0 | 650 | ○ | |
| Example 6 | 0 | 0 | 1400 | ○ | |
| Example 7 | 9 | 0 | 1350 | + | |
| Example 8 | 5 | 0 | 1320 | + | |
| Example 9 | 6 | 0 | 1350 | + | ○ |
| Example 10 | 4 | 0 | 1300 | + | |
| Example 11 | 20 | 7 | 1290 | ○ | |
| Example 12 | 0 | 0 | 1360 | ○ | |
| Example 13 | 30 | 1 | 1350 | ○ | |

TABLE 2-continued

|  | Foaming (foam height) in mm | | Etching speed in | Residues remaining after etching | |
|---|---|---|---|---|---|
|  | after 30 sec. | after 5 min. | A/min. | 1 | 2 |
| Example 14 | 4 | 0 | 1350 | o | + |
| Example 15 | 3 | 0 | 1320 | o | + |

Evaluation of residues:
x: great many residues over the whole surface
o: few residues
+: no residues at all Those skilled in the art will recognize, or be able to ascertain using no more than routine experimentation, many equivalents to the specific embodiments of the invention described herein. Such equivalents are intended to be encompassed by the following claims.

What is claimed is:

1. An etching liquid composition for transparent conducting films, consisting essentially of an aqueous solution of oxalic acid, polyoxyethylene-polyoxypropylene block copolymers, and a sulfonate type anionic surfactant, wherein polyoxyethylene-polyoxypropylene block copolymers do not contain acetylene group in the molecules.

2. The composition according to claim 1 wherein the etching liquid for transparent conducting films is an acidic solution.

3. The composition according to claim 1 wherein the transparent conducting film is an idium tin oxide (ITO) film.

4. The composition according to claim 1 wherein the concentration of the polyoxyethylene-polyoxypropylene block copolymers is in the range from 0.0001 to 10 mass percentages.

5. A method for etching transparent conducting films by applying to said films an etching liquid composition according to claim 1.

6. The method according to claim 5 wherein the transparent conducting film is an indium tin oxide (ITO) film.

* * * * *